United States Patent [19]

Tsuda

[11] 4,162,176
[45] Jul. 24, 1979

[54] METHOD FOR FORMING FLOATING GATE SEMICONDUCTOR DEVICE BY SELECTIVE ION-IMPLANTATION

[75] Inventor: Akihito Tsuda, Suwa, Japan

[73] Assignee: Kabushiki Kaisha Suwa Seikosha, Tokyo, Japan

[21] Appl. No.: 715,767

[22] Filed: Aug. 19, 1976

[30] Foreign Application Priority Data

Aug. 22, 1975 [JP] Japan .................................. 50-102425

[51] Int. Cl.² ................... H01L 21/265; H01L 21/324; B01J 17/00
[52] U.S. Cl. ................................ 148/1.5; 148/187; 357/23; 357/24; 357/59; 357/91
[58] Field of Search ..................... 357/23, 59, 91, 24; 148/1.5, 187

[56] References Cited

U.S. PATENT DOCUMENTS

| 3,945,031 | 3/1976 | Kahng et al. | 357/23 |
| 3,996,657 | 12/1976 | Simko et al. | 29/591 |
| 4,004,159 | 1/1977 | Rai et al. | 307/238 |
| 4,043,024 | 8/1977 | Iwamatsu | 29/571 |
| 4,047,974 | 9/1977 | Harari | 148/1.5 |
| 4,057,895 | 11/1977 | Ghezzo | 29/591 |

OTHER PUBLICATIONS

Golanski et al., ". . . Si Bombarded with 140 Kev Si Ions," Radiation Effects, 25, (1975), 213.

Primary Examiner—L. Dewayne Rutledge
Assistant Examiner—Upendra Roy
Attorney, Agent, or Firm—Blum, Moscovitz, Friedman & Kaplan

[57] ABSTRACT

A semiconductor device for use as a non-volatile semiconductor memory is provided with a floating gate formed by ion implantation.

15 Claims, 5 Drawing Figures

METHOD FOR FORMING FLOATING GATE SEMICONDUCTOR DEVICE BY SELECTIVE ION-IMPLANTATION

BACKGROUND OF THE INVENTION

This invention relates generally to semiconductor devices of the type having a floating gate and capable of utilization as a non-volatile memory. In conventional floating gate semiconductor devices, a thin film formed of a conductive material, as, for example, polycrystaline silicon is utilized as the floating gate of a non-volatile semiconductor memory. Such conductive material is generally characterized by an ability to withstand high heat treatment but numerous process steps are required to produce such conventional floating gate semiconductor devices, thereby causing lessened reliability and increased cost. By providing a floating gate semiconductor device wherein the floating gate is formed by ion implantation, the foregoing deficiencies are overcome.

SUMMARY OF THE INVENTION

Generally speaking, in accordance with the invention, a floating gate semiconductor device is provided wherein said floating gate is formed by ion implantation. In one embodiment, a source and drain are formed in spaced relation in a semiconductor substrate of a first conductivity by diffusing impurities in the surface thereof of a second conductivity opposite to said first conductivity. An oxide film is formed on the surface of the diffused substrate and a photo-resist film is formed on the surface of said oxide except in the region of the gate of the semiconductor device intermediate said source and drain regions. The floating gate is then formed in the surface of said oxide film by ion implantation. The photo-resist layer is removed and an oxide film is formed over said first-mentioned oxide film and the ion implanted floating gate. Electrical connection is made to the source and drain regions by photo etching and deposit of a layer of a conductive material such as aluminum and a final oxide film is formed on the device.

Accordingly, it is an object of this invention to improve the characteristics of a floating gate non-volatile semiconductor memory.

Another object of the invention is to simplify the process of forming a floating gate non-volatile semiconductor memory.

Still other objects and advantages of the invention will in part be obvious and will in part be apparent from the specification.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
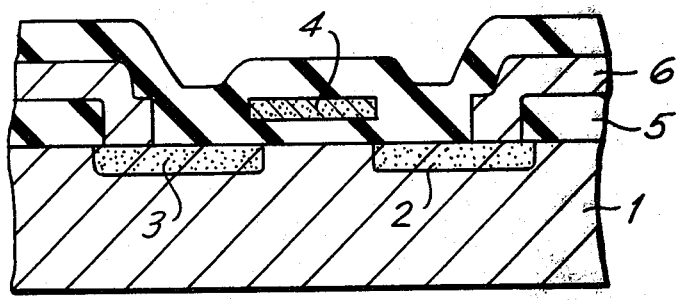
FIG. 1 is a cross sectional view of a prior art floating gate semiconductor device for use as a non-volatile memory.

Referring first to FIG. 1, the conventional non-volatile semiconductor memory depicted is formed with a doped polycrystaline silicon floating gate. The semiconductor device of FIG. 1 is formed by providing a monocrystaline silicon substrate doped with impurities of a first conductivity type in which is formed source region 2 and drain region 3 by diffusing impurities of a second conductivity type opposite to said first conductivity type. A field oxide film is formed on the surface of the diffused substrate by a field oxidation process and thereafter the portion of the oxide film in the gate region intermediate the source and drain regions of the device is removed by photo-chemical etching. A gate oxide film is then formed in the gate region by conventional gate oxidation techniques. A polycrystaline silicon layer is formed on the gate oxide film by chemical vapor deposit (CVD). A further silicon oxide film is formed by CVD in order to permit shaping of the polycrystaline silicon film into the required shape since a photo-resist film cannot be used in conjunction with an etching liquid for shaping the polycrystaline silicon. Thus, first the CVD oxide film is etched by a photo-chemical etching process and then the polycrystaline silicon film is etched using the oxide film as a mask to produce a floating gate 4 of the required shape. Thereafter, the non-volatile semiconductor memory of FIG. 1 is completed by the process of forming an oxide film to insulate the floating gate, forming aluminum interconnections fixed to the source and the drain regions and forming a protective oxide film over the entire device.

As described above, the step of forming and etching the polycrystaline silicon floating gate 4 of a conventional floating gate semiconductor device requires numerous steps, resulting in decreased reliability and increased cost.

The foregoing difficulties are avoided by forming the floating gate of a non-volatile semiconductor memory by means of ion implantation. Information may be stored or written into a non-volatile semiconductor memory having a floating gate by means of avalanche breakdown at the drain junction, electrons having high energy produced by the avalanche breakdown are implanted and accumulated into the floating gate. Once such avalanche breakdown implantation occurs, the source-drain path is rendered conductive, conduction being permitted by the electric charge implanted into the floating gate. When the source-drain path of the semiconductor device is conductive, the element is deemed actuated, a state distinguishable from the non-actuated condition, thereby providing a memory. Electric charge, once implanted, can be maintained for a long time by electrically insulating the floating gate from the outside by using silicon oxide films and the like. The duration over which the electric charge is retained depends on the quality of the material of the floating gate and the material for insulating the floating gate, among other factors.

Referring now to FIGS. 2A, 2B, 2C and 2D, the method of manufacturing the semiconductor device in accordance with the invention is depicted. Generally speaking, the floating gate is formed by covering all but the gate region of an oxide film with a photo-resist film and forming the floating gate by means of ion implantation in the gate region. In order to provide a satisfactory floating gate semiconductor device, it is necessary for the material used as a floating gate to be able to accumulate the electric charge and not be diffused into the oxide film by heat treatment. Since the floating gate is formed by direct ion implantation, the steps of etching the oxide film and polycrystaline silicon in the prior art method of manufacture is avoided, thereby resulting in improved reliability and reduced cost.

Figure 2A:
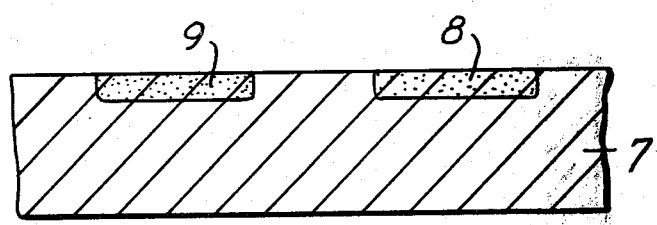
FIGS. 2A. 2B, 2C and 2D are sectional views depicting the steps in the manufacture of a floating gate semiconductor device for use as a non-volatile memory in accordance with the invention.
Figure 2B:
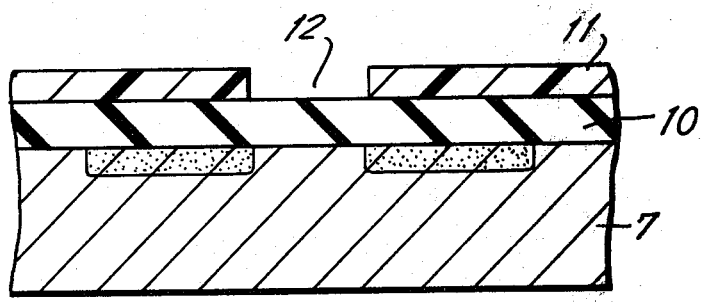

Specifically, referring to the drawings, a P-channel type semiconductor device using an N-type silicon substrate will be described by way of example. As shown in FIG. 2A, a source region 8 and a drain region 9 are formed by diffusing P-type impurities into the surface of the N-type silicon substrate by conventional diffusion techniques. A dry oxide film 10 as shown in FIG. 2B then is formed on the surface of the substrate by the dry oxidation process in an oxygen atmosphere. A photo-resist film 11 is formed on the dry oxide film and that portion of the photo-resist film in the gate region intermediate the source and drain is removed to expose the oxide film 10. Ion implantation is performed on the device as it is in the configuration as depicted in FIG. 2B to form a floating gate 13 in the surface of oxide film 10 in the gate region. By way of example, good results were obtained by implanting silicons by $10^{16}$ per cm$^2$ and borons by $10^{14}$ per cm$^2$. Further by way of example, where a floating gate is formed by implanting only silicons, essentially the same results were obtained.

It is essential that the implanted materials in the oxide layer forming the floating gate not pass through the oxide layer. It is further necessary that the ion implantation be at a voltage which produces the desired distribution. The pertinent acceleration voltage is determined from the thickness of the gate oxide film. In one embodiment, ion implantation into a gate oxide film of 2500 Å at 20 KeV.

Figure 2C:
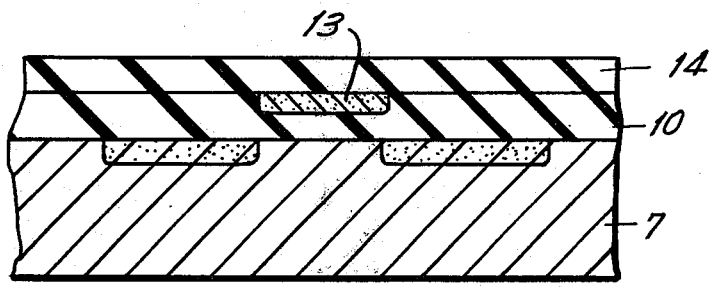
Figure 2D:
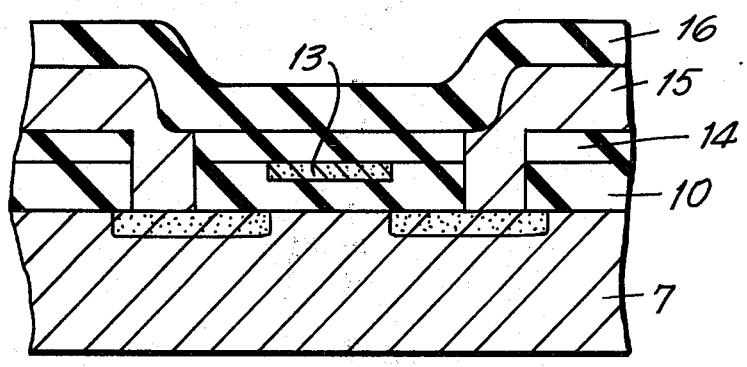

After ion implantation, as more particularly shown in FIG. 2C, a CVD oxide film 14 is formed on the surface of oxide layer 10, after removal of the photo-resist layer 11, in order to insulate the floating gate 13. The device is subjected to a wet treatment and a nitrogen treatment in order to insure the proper insulation of the floating gate 13.

A contact hole in registration with each of the source and drain is then formed in the oxide layers to permit electrical connection to the source and drain regions. Aluminum is evaporated upon the device, the aluminum 15 making electrical connection to the respective source and drain regions through the contact holes. The aluminum is suitably shaped to define electrical conductors 15 by a photo-chemical etching technique. As more particularly shown in FIG. 2D, a CVD silicon oxide film 16 is formed over the device to protect the aluminum interconnections. Finally, the bonding-pad portions of the aluminum conductors (not shown) are exposed by photo-chemical etching to form a non-volatile semiconductor memory having a floating gate.

Although the specific embodiments described above were characterized by the ion implantation of silicons and borons to define the floating gate, the arrangement in accordance with the invention is not restricted to the use of such materials. Other materials can be used provided they satisfy the performance requirements of a floating gate. Semiconductor materials and metallic materials can be used. Among these materials, a material of group VIb, a group represented by molybdenum, and a material of group IVb, a group represented by zirconium, may be utilized. Further, the semiconductor materials and metallic materials, for instance silicon and germanium, which provide advantageous characteristics when subjected to heat treatment, may be utilized.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method for forming a floating gate semiconductor device having a substrate, source and drain regions formed in spaced relation on the surface of said substrate and an insulating layer on the surface of said substrate at least in the region between said source and drain regions, comprising the steps of providing a substrate of a first conductivity type, forming source and drain regions in spaced relation in said substrate by diffusing impurities of a second conductivity type opposite to said first conductivity type in the surface of said substrate; forming an oxide layer on the surface of said substrate; forming a photo-resist layer on the surface of said oxide before ion implantation, said photo-resist layer having an opening therethrough exposing the surface of said oxide intermediate said source and drain regions of said substrate; and forming a floating gate in the surface of said oxide layer in the region intermediate said source and drain by ion implantation without implanting ions in said substrate or the surface of said oxide layer covered by said photo-resist layer.

2. The method as recited in claim 1, including removing said photo-resist layer after ion implantation and forming a second oxide layer over said first oxide layer and floating gate to insulate said floating gate.

3. The method as recited in claim 1, wherein said oxide film is formed by the dry oxidation process.

4. The method as recited in claim 1, wherein said ion implantation is of a material selected from the group including at least one of silicons and borons.

5. The method as recited in claim 1, wherein said ion implantation is by a material selected from the group of semiconductor materials and metallic materials.

6. The method as recited in claim 1, wherein said ion implantation is by a material selected from one of a group VIb and a group IVb material.

7. The method as recited in claim 1, wherein said ion implantation is performed at a voltage selected in relation to the thickness of said oxide film so as to provide a floating gate without permitting any of the implanted materials to pass through the oxide film.

8. The method as recited in claim 2, including forming openings in said first and second oxide layers in the region of said source and drain; forming a layer of conductive material extending through said openings and on the surface of said second oxide layer to provide conductive connections to said source and drain; and forming a third oxide layer over said conductors and second oxide layer for protecting same.

9. The method as recited in claim 2, wherein said second oxide film is a CVD oxide film.

10. The method as recited in claim 5, wherein said ion implantation is by a material selected from the group including silicon and germanium.

11. The method as recited in claim 5, wherein said ion implantation is of a material selected from the group including silicons and borons.

12. The method as recited in claim 6, wherein said ion implanation material is selected from one of a group including molybdenum and zirconium.

13. The method as recited in claim 7, wherein the oxide film is of a thickness of about 2500 Å, said ion implantation being performed at an acceleration voltage of about 20 KeV.

14. The method as recited in claim 8, wherein said third oxide film is a CVD silicon oxide film.

15. The method as recited in claim 8, wherein said conductive material is deposited aluminum.

* * * * *